US011092627B2

(12) United States Patent
Ha et al.

(10) Patent No.: US 11,092,627 B2
(45) Date of Patent: Aug. 17, 2021

(54) METHOD FOR MEASURING THE PERFORMANCE OF A RENEWABLE ENERGY POWER PLANT, METHOD FOR DETECTING AN OPERATIONAL MALFUNCTION OF A RENEWABLE ENERGY POWER PLANT AND DEVICE IMPLEMENTING SAID METHODS

(71) Applicant: COMMISSARIAT A L'ENERGIE ATOMIQUE ET AUX ENERGIES ALTERNATIVES, Paris (FR)

(72) Inventors: Duy Long Ha, Chambery le Vieux (FR); Hervé Guillou, Paris (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 340 days.

(21) Appl. No.: 16/132,771

(22) Filed: Sep. 17, 2018

(65) Prior Publication Data
US 2019/0086455 A1 Mar. 21, 2019

(30) Foreign Application Priority Data
Sep. 18, 2017 (FR) ...................... 1758615

(51) Int. Cl.
*G01R 21/133* (2006.01)
*G01R 31/40* (2020.01)
(Continued)

(52) U.S. Cl.
CPC ....... *G01R 21/133* (2013.01); *G01R 31/3648* (2013.01); *G01R 31/40* (2013.01);
(Continued)

(58) Field of Classification Search
CPC .. G01R 21/133; G01R 31/3648; G01R 31/40; G01R 22/06; G05B 15/02; H02S 50/10; Y02E 10/50
See application file for complete search history.

(56) References Cited

U.S. PATENT DOCUMENTS

| | | |
|---|---|---|
| 2010/0185337 A1 | 7/2010 | Le Pivert |
| 2016/0378890 A1 | 12/2016 | Haku |

(Continued)

FOREIGN PATENT DOCUMENTS

| | | | |
|---|---|---|---|
| EP | 3 016 278 A1 | 5/2016 | |
| WO | WO 2011/117485 A1 | 9/2011 | |

OTHER PUBLICATIONS

Search Report as issued in French Patent Application No. 1758615, dated May 4, 2018.

*Primary Examiner* — Alexander Satanovsky
*Assistant Examiner* — Lyudmila Zaykova-Feldman
(74) *Attorney, Agent, or Firm* — Pilsbury Winthrop Shaw Pitman LLP

(57) ABSTRACT

A method for detecting an operational malfunction of a renewable energy power plant includes measuring the energy production of the power plant over a time period, designated production period $T_{prod}$; calculating an actual production indicator from the production measured during the measuring of the energy production; calculating, from a physical model of the power plant, a theoretical production indicator over the production period $T_{prod}$; calculating the ratio between the actual production indicator and the theoretical production indicator over the production period $T_{prod}$; the measurement of the performance being given by the value of the ratio between the actual production indicator and the theoretical production indicator.

9 Claims, 4 Drawing Sheets

(51) Int. Cl.
  *H02S 50/10* (2014.01)
  *G01R 31/36* (2020.01)
  *G05B 15/02* (2006.01)
  *G01R 22/06* (2006.01)

(52) U.S. Cl.
  CPC .............. *G05B 15/02* (2013.01); *H02S 50/10* (2014.12); *G01R 22/06* (2013.01)

(56) References Cited

U.S. PATENT DOCUMENTS

2016/0380444 A1* 12/2016 Al Shakarchi ........ H02J 7/0021
  320/107
2018/0069401 A1* 3/2018 Pflaum .................... H02J 3/381

* cited by examiner

METHOD FOR MEASURING THE PERFORMANCE OF A RENEWABLE ENERGY POWER PLANT, METHOD FOR DETECTING AN OPERATIONAL MALFUNCTION OF A RENEWABLE ENERGY POWER PLANT AND DEVICE IMPLEMENTING SAID METHODS

CROSS-REFERENCE TO RELATED APPLICATIONS

This application claims priority to French Patent Application No. 1758615, filed Sep. 18, 2017, the entire content of which is incorporated herein by reference in its entirety.

TECHNICAL FIELD OF THE INVENTION

The technical field of the invention is that of renewable energy production power plants. The present invention relates to a method for monitoring the operation of such a power plant and in particular a method for measuring the performance of a renewable energy power plant and a method for detecting an operational malfunction, the detection being carried out from the measurement of the performance. The invention also relates to a device for measuring the performance of a renewable energy power plant and for detecting an operational malfunction of a renewable energy power plant implementing said methods.

TECHNOLOGICAL BACKGROUND OF THE INVENTION

Renewable energy production power plants are complex systems of which it is difficult to measure the performances. It is however important to detect malfunctions in the operation of a production power plant, for example by means of a performance indicator. Yet, no reliable method exists today capable of attributing, for a given operating period, a performance indicator taking account of the operation of a power plant in a reliable manner.

There thus exists a need for a method making it possible to measure the performance of a renewable energy power plant in a reliable manner and, potentially, to detect malfunctions in the operation of the power plant in order to be able to identify and potentially correct said malfunctions. There also exists a need for a device enabling such a method to be implemented.

SUMMARY OF THE INVENTION

The invention offers a solution to the aforementioned problems by enabling a measurement of the performance of a renewable energy power plant and, from said measurement, detecting a malfunction in the operation of said power plant.

To do so, a first aspect of the invention relates to a method for measuring the performance of a renewable energy power plant including:
- a step of measuring the energy production of the power plant over a time period, designated production period $T_{prod}$;
- a step of calculating an actual production indicator from the production measured during the step of measuring the energy production;
- a step of calculating a theoretical production indicator over the production period $T_{prod}$ from a physical model of the power plant;
- a step of calculating the ratio between the actual production indicator and the theoretical production indicator over the production period $T_{prod}$;

the measurement of the performance being given by the value of the ratio between the actual production indicator and the theoretical production indicator.

Thanks to the invention, it is possible to measure the performance of a power plant over a given production period. Furthermore, the measurement of the performance for successive production periods also makes it possible to measure the influence of measures potentially taken to improve the operation of the power plant. As will be shown hereafter, the measurement of the performance may also make it possible to detect an operational malfunction of the power plant.

Apart from the characteristics that have just been mentioned in the preceding paragraph, the method according to a first aspect of the invention may have one or more complementary characteristics among the following, considered individually or according to all technically possible combinations thereof.

Advantageously, the actual production indicator is obtained using the following formula:

$$I_p(T_{prod}) = \int_0^{T_{prod}} \{k_1(t) p_{measurement}(t) - k_2(t) f(p_{measurement}(t), p_{forecast}(t))\} dt$$

where $I_p$ is the actual production indicator, $p_{measurement}(t)$ is the supplied power at the instant t, $p_{forecast}(t)$ is the forecast power at the instant t, $T_{prod}$ is the production period, $k_1(t)$ and $k_2(t)$ are time dependent positive weighting factors and f is a function defining a penalty as a function of the supplied power $p_{measurement}(t)$ and the forecast power $p_{forecast}(t)$.

Advantageously, the theoretical production indicator is a function of the theoretical production over the production period $T_{prod}$ calculated from the physical model of the power plant.

Advantageously, the theoretical production indicator is calculated from the theoretical production $p_{th}(t)$ at an instant t maximising the following relationship, noted $p^*_{th}$:

$$\int_0^{T_{prod}} k_3(t) p_{th}(t) dt$$

where $k_3(t)$ is a time dependent positive weighting coefficient and $p_{th}(t)$ is the theoretical production at a time t, the theoretical production indicator being equal to:

$$I_{th}(T_{prod}) = \int_0^{T_{prod}} p^*_{th}(t)$$

Thus, the theoretical production indicator $I_{th}$ takes account of the fact that it may be preferable to produce at certain moments of the production period, for example when demand is high.

Advantageously, the method also includes a step of displaying the operating performance. Thus, it is possible to visualise, for the considered production period, the measured performance.

Advantageously, the display step comprises:
- a sub-step of displaying information concerning the value of the actual and/or theoretical production indicator; and
- a sub-step of displaying information concerning the evolution of one or more physical quantities associated with the energy production over the production period $T_{prod}$.

Thus, it is possible to know the values of the physical quantities associated with the energy production and potentially to compare them with the physical values obtained during previous production periods.

Advantageously, the renewable energy power plant comprises at least one battery, the method being characterised in that one of the physical quantities associated with the energy production displayed during the step of displaying the operating performance is the state of charge of the battery during the production period $T_{prod}$ and the theoretical state of charge of the battery for said period. Theoretical state of charge is taken to mean the state of charge relative to the theoretical production.

A second aspect of the invention relates to a method for detecting an operational malfunction of a renewable energy power plant characterised in that it includes:
  a step of measuring the performance of a renewable energy power plant using a method according to one of the preceding claims;
  a step of detecting an operational malfunction when the ratio between the actual performance indicator and the theoretical performance indicator is below a predetermined value.

Thus, from the measurement of the performance obtained using a method according to a first aspect of the invention, it is possible to detect a potential dysfunction of a renewable energy power plant.

A third aspect of the invention relates to a device for measuring the performance of a renewable energy power plant including means configured to:
  measure the energy production of the power plant over a time period, designated production period $T_{prod}$;
  calculate an actual production indicator from the production measured during the measurement of the energy production;
  calculate, from a physical model of the power plant, a theoretical production indicator over the production period $T_{prod}$.
  calculate the ratio between the actual production indicator and the theoretical production indicator over the production period $T_{prod}$.

Advantageously, the device also includes means for detecting an operational malfunction when the ratio between the actual performance indicator and the theoretical performance indicator is below a predetermined value.

A fourth aspect of the invention relates to a computer programme product including instructions which lead the device according to a third aspect of the invention to execute the steps of the method according to a first aspect of the invention or a second aspect of the invention.

A fifth aspect of the invention relates to a computer readable support, on which is recorded the computer programme according to a fourth aspect of the invention.

The invention and its different applications will be better understood on reading the description that follows and by examining the figures that accompany it.

BRIEF DESCRIPTION OF THE FIGURES

The figures are presented for indicative purposes and in no way limit the invention.

DETAILED DESCRIPTION OF AT LEAST ONE EMBODIMENT OF THE INVENTION

Unless specified otherwise, a same element appearing in the different figures has a single reference. Hereafter, time may be considered as a continuous variable t ranging from 0 to the production period $T_{prod}$ or instead discrete k ranging from 1 to K. Furthermore, when a focus is made on the value of a physical quantity f over the entire production period, the following two notations are equivalent:

$$\int_0^{T_{prod}} f(t)dt \sim \sum_{k=1}^{K} f(k)$$

Moreover, a physical quantity X over the production period $T_{prod}$ will be noted $X(T_{prod})$. This same physical quantity at an instant t will be noted x(t) such that $X(T_{prod}) = \int_0^{T_{prod}} x(t)\,dt$ or $X(T_{prod}) = \Sigma_{k=1}^{K} x(k)$.

Figure 1:
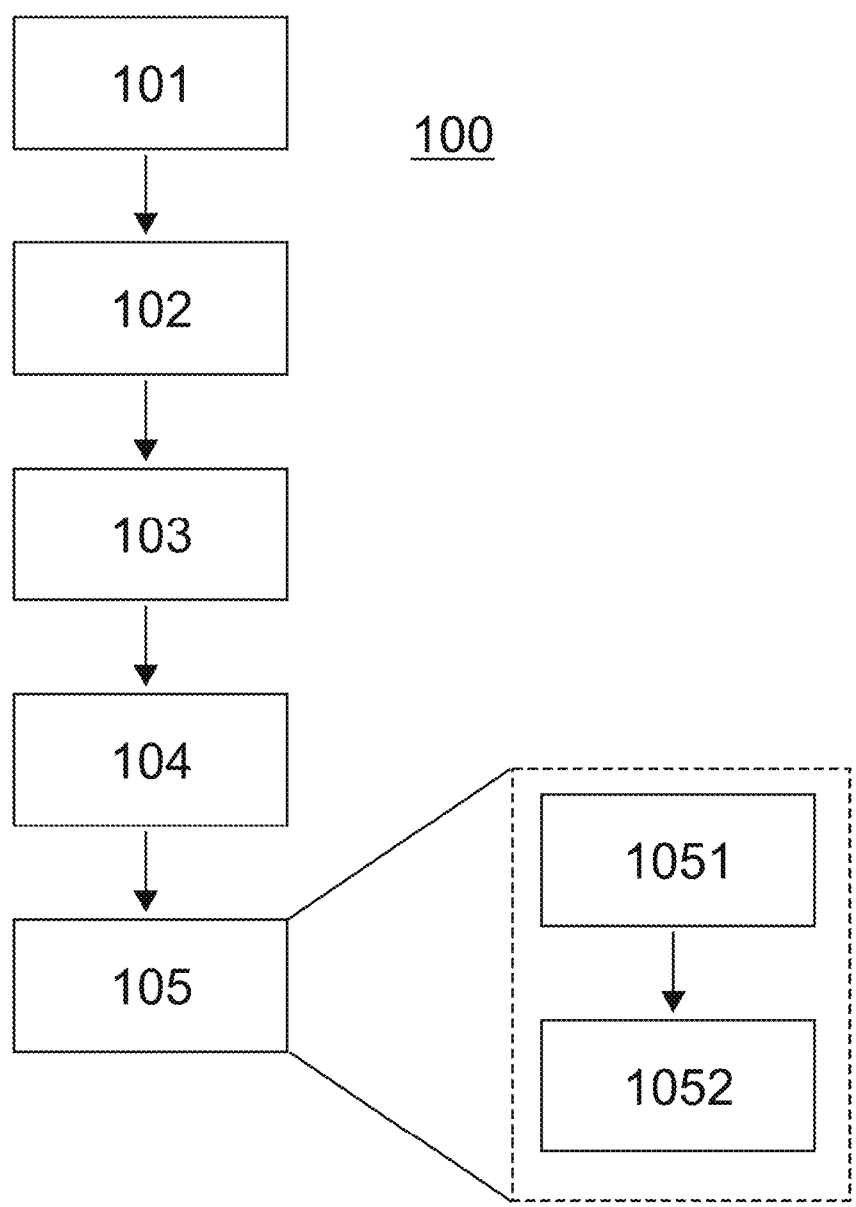
FIG. 1 shows a flow chart of a method according to a first aspect of the invention.

A first embodiment according to a first aspect of the invention illustrated in FIG. 1 relates to a method 100 for measuring the performance of a renewable energy power plant. The method comprises a step 101 of measuring the energy production of the power plant over a time period, designated production period $T_{prod}$, a step 102 of calculating an actual production indicator $I_p$ from the production measured during the step 101 of measuring the energy production; a step 103 of calculating, from a physical model of the power plant, a theoretical production indicator $I_{th}$ over the production period $T_{prod}$; a step 104 of calculating the ratio R between the actual production indicator $I_p$ and the theoretical production indicator $I_{th}$ over the production period $T_{prod}$ (in other words $$R = \frac{I_p(T_{prod})}{I_{th}(T_{prod})});$$

the measurement of the performance being given by the value of the ratio R between the actual production indicator $I_p$ and the theoretical production indicator $I_{th}$.

In one embodiment, the actual production indicator is obtained using the following formula:

$$I_p(T_{prod}) = \int_0^{T_{prod}} \{k_1(t)p_{measurement}(t) - k_2(t)f(p_{measurement}(t), p_{forecast}(t))\}dt$$

where $I_p$ is the actual production indicator, $p_{measurement}(t)$ is the supplied power at the instant t, $p_{forecast}(t)$ is the forecast power at the instant t, $T_{prod}$ is the production period, $k_1(t)$ and $k_2(t)$ are time dependent positive weighting factors and f is a function defining a penalty as a function of the supplied power $p_{measurement}(t)$ and the forecast power $p_{forecast}(t)$. The time dependent weighting factors make it possible to modulate the calculation of the indicator as a function of time over the production period $T_{prod}$, for example to give greater weighting to the penalty when energy demand is high and thus any difference in the production harmful for the stability of the grid.

In one exemplary embodiment, the function defining a penalty is given by:

$$f(p_{measurement}(t), p_{forecast}(t)) = p_{measurement}(t) - p_{forecast}(t)$$

Thus, the penalty is equal to the difference between the forecast and the actual production.

In one embodiment, the weighting factors are constant and such that $k_1(t)=K_1$ and $k_2(t)=K_2$ and the function f depends linearly on the supplied power $p_{measurement}(t)$ and on the forecast power $p_{forecast}(t)$ such that the actual production indicator can be expressed using the following formula:

$$I_p(T_{prod})=K_1 p_{measurement}(T_{prod})-K_2 f(p_{measurement}(T_{prod}), p_{forecast}(T_{prod}))$$

In this embodiment, the ratio R thus takes the following form:

$$R = \frac{K_1 P_{measurement}(T_{prod}) - K_2 f(P_{measurement}(T_{prod}), P_{forecast}(T_{prod}))}{I_{th}(T_{prod})}$$

In one embodiment $K_1=K_2=1$.

In one embodiment, the theoretical production indicator $I_{th}$ is a function of the theoretical production $p_{th}(t)$ at each instant t calculated from the physical model of the power plant. In one embodiment, the theoretical production indicator $I_{th}$ is calculated from the theoretical production $p_{th}(t)$ at an instant t maximising the following relationship (called optimal theoretical production and noted $p^*_{th}$):

$$\int_0^{T_{prod}} k_3(t) p_{th} dt$$

where $k_3(t)$ is a time dependent positive weighting coefficient. In other words:

$$\max(\int_0^{T_{prod}} k_3(t) p_{th}(t) dt) = \int_0^{T_{prod}} k_3(t) p^*_{th}(t) dt$$

Once the optimal theoretical production $p^*_{th}(t)$ at an instant t has been determined, the theoretical production indicator $I_{th}$ over the production period $T_{prod}$ may be calculated using the following formula:

$$I_{th}(T_{prod}) = \int_0^{T_{prod}} p^*_{th}(t)$$

In one embodiment, the coefficient $k_3(t)$ is a constant $K_3$, for example $K_3=1$. In an alternative embodiment, the coefficient $k_3(t)$ is a function of the energy demand on the energy grid to which the renewable energy power plant is connected. Thus, the theoretical production indicator $I_{th}$ takes account of the fact that it may be preferable to produce at certain moments of the production period, for example when demand is high.

In one embodiment, the method 100 also includes a step 105 of displaying the operating performance. Preferably, the step 105 of displaying the operating performance comprises a sub-step 1051 of displaying information concerning the value of the ratio R between the actual production indicator $I_p$ and the theoretical production indicator $I_{th}$ and said indicators; and a sub-step 1052 of displaying information concerning the evolution of one or more physical quantities associated with the energy production over the production period $T_{prod}$.

In one embodiment, the renewable energy power plant comprises at least one battery and one of the physical quantities associated with the energy production displayed during the step 105 of displaying the operating performance is the state of charge SOC of the battery during the production period $T_{prod}$ and the theoretical state of charge of the battery $SOC_{th}$ for said period. The theoretical state of charge of the battery $SOC_{th}$ is determined from the optimal theoretical production $p^*_{th}(t)$ and corresponds to the state of charge of the battery SOC that would have been measured if the operation of the power plant had been in accordance with that forecast in the calculation of the optimal theoretical production $p^*_{th}(t)$.

In one embodiment, the performance of the power plant is classified into four levels:
$R \geq 0.85$, optimal;
$0.85 > R \geq 0.75$, suitable;
$0.75 > R \geq 0.5$, degraded;
$R < 0.5$, problematic.

Thus, the method makes it possible to identify if the operation of the power plant is optimal (no failure), if the operation of the power plant is suitable, but may be improved (slight failure), if the operation of the power plant is degraded, but that said power plant is still operational (moderate failure); and if the operation of the power plant is problematic, said power plant no longer being operational (serious failure). It will be noted that the measurement of the performance for successive production periods also makes it possible to measure the influence of measures potentially taken to improve the operation of the power plant. Furthermore, as will now be seen, the measurement of the performance can also make it possible to detect an operational malfunction of the power plant.

To do so, one embodiment according to a second aspect of the invention relates to a method for detecting an operational malfunction of a renewable energy power plant including a step of measuring the performance of a renewable energy power plant using a method 100 according to a first aspect of the invention and a step of detecting an operational malfunction when the ratio R between the actual production indicator $I_p$ and the theoretical production indicator $I_{th}$ is below a predetermined value. Indeed, as has been detailed above, this ratio can highlight malfunctions in the operation of the power plant.

In one embodiment, a malfunction is detected when the ratio between the actual production indicator $I_p$ and the theoretical production indicator $I_{th}$ is below 0.75 or even below 0.5.

Figure 2:
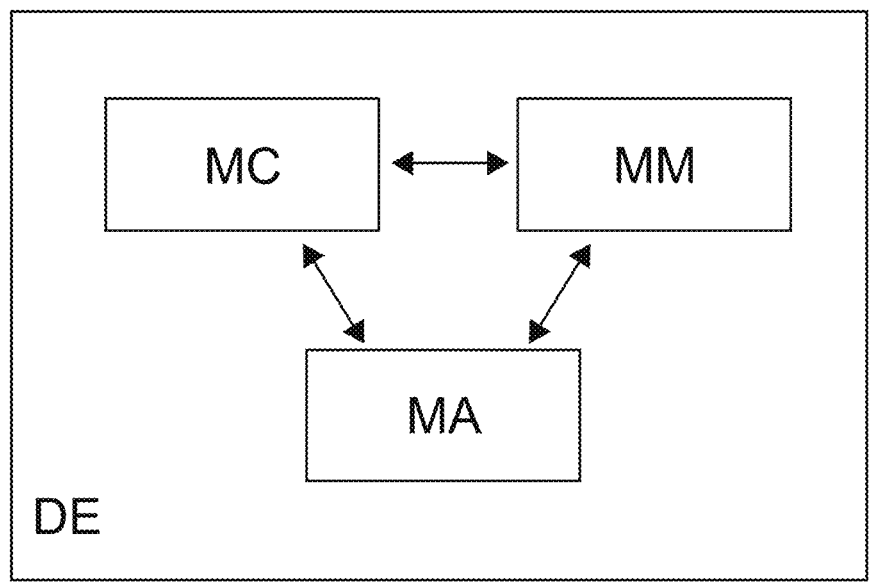
FIG. 2 shows a schematic representation of a device according to a third aspect of the invention.

In order to be able to implement the method according to a first or a second aspect of the invention, one embodiment according to a third aspect of the invention illustrated in FIG. 2 relates to a device DE for measuring the performance of a power plant and for detecting an operational malfunction of a renewable energy power plant. The device DE includes means MM configured to measure the energy production of the power plant over a time period, designated production period $T_{prod}$. The measurement may notably be carried out using the command control system of the power plant. For example, the actual production may be measured by a reactive power sensor at the output of the power plant.

The device DE also includes means MC configured to calculate an actual production indicator $I_p$ from the measured production; means MC configured to calculate, from a physical model of the power plant, a theoretical production indicator $I_{th}$ over the production period $T_{prod}$ means MC configured to calculate the ratio R between the actual production indicator $I_p$ and the theoretical production indicator $I_{th}$ over the production period $T_{prod}$. Said calculations may be carried out using a processor associated with a memory, a reprogrammable integrated circuit or instead an ASIC (Application Specific Integrated Circuit) card. In one embodiment, the calculation means MC include a processor associated with a memory in which is stored a computer programme including instructions which lead the device DE to execute the steps of the methods detailed previously. The device DE may also comprise means for entering data concerning the physical model of the power plant (or any other data necessary for the implementation of the device) such as a keyboard and/or a mouse associated with a screen or instead a touch screen. In an alternative or complementary manner, the device DE may comprise means for connecting (for example an Ethernet card or WIFI) to a network (for example Internet), the parameters concerning the physical model of the power plant being recovered on a server, for example the server of the power plant manufacturer. In all cases, the information obtained by the connection and/or entry means is accessible to the calculation means MC.

Furthermore, the device DE includes means MA configured to display the operating performance. This display may be done through a screen, for example a touch screen. Alternatively or in a complementary manner, the device DE according to a third aspect of the invention may be connected to a network, for example a GSM type network, and the display may then take place on a remote terminal, for example a tablet or a smartphone).

Finally, the means MM,MC,MA for measuring, calculating and displaying communicate with each other through a communication means, for example a bus, a local or extended network such that the measurements obtained from the measurement means MM are capable of being communicated to the calculation means MC and said calculation means MC are capable of displaying information such as the performance and/or the production indicators through display means MA.

In one embodiment, the device DE also includes means configured to detect an operational malfunction when the ratio between the actual performance indicator and the theoretical performance indicator is below a predetermined value. This detection may be carried out by the calculation means MC of the device DE described previously. The predetermined value may be entered by a user using, for example, the entry means used during the entry of the parameters of the physical model of the power plant. In this case, the means MA configured to display the operating performance may also be configured to display an operational malfunction when such a malfunction is detected.

Figure 3:
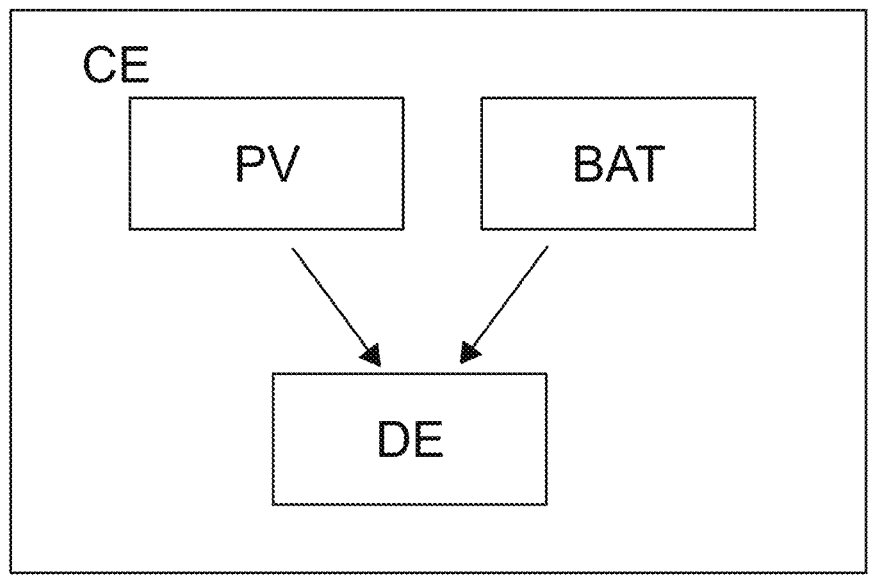
FIG. 3 shows a power plant equipped with a device according to a third aspect of the invention.

In one exemplary embodiment illustrated in FIG. 3, the power plant CE is a photovoltaic power plant including at least one photovoltaic panel PV and at least one battery BAT. The power plant also comprises a device DE according to a third aspect of the invention, said device receiving information (photovoltaic production, state of charge, etc.) from the battery or the batteries BAT and from the photovoltaic panel or panels PV. The power supplied by the photovoltaic panel or panels PV at the instant t will be noted $p_{pv}(t)$. The state of charge SOC of the battery or the batteries at an instant t will be noted $soc(t)$. In this exemplary embodiment, the physical model of the battery or the batteries BAT linking the state of charge $soc(t)$ at an instant t with a state of charge at an instant t+dt takes the form of the following equation:

$$soc(t+dt) = soc(t) + \mathit{eff}(t) \times \left(\frac{p_{bat}(t)}{C_{bat}}\right)$$

where soc belongs to the set [0,1], $p_{bat}(t)$ is the power supplied by the battery BAT at an instant t, $C_{bat}$ is the capacity associated with the battery or the batteries BAT and $\mathit{eff}(t)$ is the output of the battery BAT at the instant t. More specifically, the output of the battery or batteries at an instant t takes the form of the following function:

$$\mathit{eff}(t) = f(p_{bat}(t), soc(t))$$

In order to model the system, it is usual to divide in a discrete manner the production period $T_{prod}$. For example, for a production period of one day, a time division $\Delta t$ of one minute may be chosen. The expression of the state of charge then becomes:

$$soc(k+1) = soc(k) + \mathit{eff}(k) \times \left(\frac{p_{bat}(k)}{C_{bat}}\right)$$

where k is a positive integer belonging to [1, K] with K=1440. Thus the production period $T_{prod}$ is equal to K×$\Delta t$ with $\Delta t$ a time step of one minute. The expression for the efficiency for its part becomes:

$$\mathit{eff}(k) = f(p_{bat}(k), soc(k))$$

Furthermore, with a production period $T_{prod}$ equal to 24 h, the hypothesis may be made that the state of charge SOC at the start ($soc(1)$) and end ($soc(K)$) of the production period $T_{prod}$ must be the same. This condition may be expressed in the following form:

$$soc(1) = soc(K) = soc_{measurement} \quad (1)$$

where $SOC_{measurement}(1)$ is the initial state of charge measured at the beginning of the production period.

Figure 4:
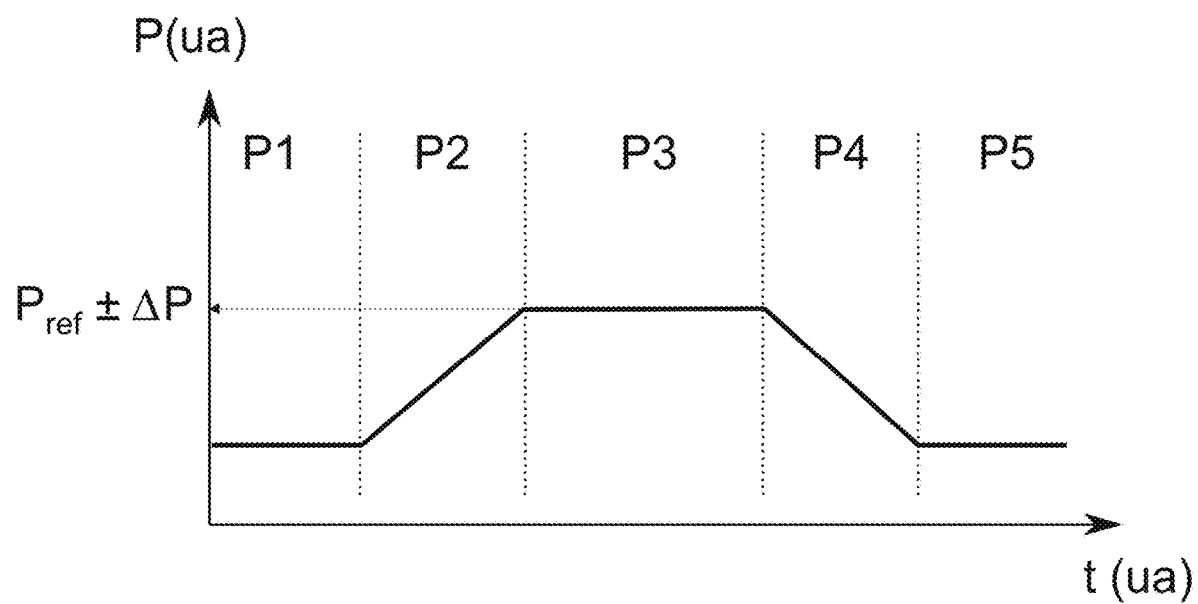
FIG. 4 shows a representation of a production plan for a given production period.

The calculation of the theoretical production indicator $I_{th}$ is going to take place as a function of the preceding model, but also as a function of a production plan for the production period $T_{prod}$. As illustrated in FIG. 4, the production plan may, for example, be divided into five phases:
- a first phase designated preparation phase;
- a second phase designated rise phase;
- a third phase designated stabilisation phase;
- a fourth phase designated descent phase;
- a fifth phase designated end of production phase.

From this production plan and from the measurement of the production during the considered period, it is possible to know the forecast power $p_{forecast}$ and thus the actual production indicator $I_p$ for the considered production period.

In order to determine the theoretical production $p_{th}$ (and thus the theoretical production indicator $I_{th}$), it is necessary to simulate these five phases. To do so, a binary variable at each instant k noted $\delta(n, k)$ is used with n an integer equal to 1 for the first phase, 2 for the second phase, 3 for the third phase, 4 for the fourth phase and 5 for the fifth phase. The theoretical production $p_{th}$ at each instant k may then be expressed in the following manner:

$$p_{th}(k) = \sum_{n=1}^{5} \delta(n, k) \times \mathrm{Phase}(n, k)$$

With:
Phase(1, k)=0
Phase(2, k+1)≥ramp$_1$×Phase(2, k) where ramp$_1$ is a positive coefficient associated with the rise phase ramp;
P$_{ref}$+$\Delta$P≥Phase(3,k)≥P$_{ref}$−$\Delta$P where P$_{ref}$ is the reference power during the stabilisation phase and $\Delta$P is the margin of error (the latter is generally set by the manager and/or the owner of the power plant);
Phase(4, k+1)≤ramp$_2$×Phase$_4$(4, k) where ramp$_2$ is a negative coefficient associated with the rise phase ramp;
Phase(5, k)=0;
$\Sigma_{n=1}^{5} \delta(n, k) = 1 \forall k \in [1, K]$.

In one embodiment, the margin of error ΔP is equal to 5% of the reference power $P_{ref}$.

Furthermore, the theoretical production $p_{th}(k)$ at an instant k is equal to the power supplied by the solar panel or solar panels $p_{pv}(k)$ at an instant k and the power supplied by the battery or the batteries $p_{bat}(k)$ at an instant k such that:

$$p_{th}(k)=p_{pv}(k)+p_{bat}(k)$$

A theoretical performance indicator is next calculated by determining the theoretical production maximising the following relationship:

$$\sum_{k=1}^{K} p_{th}(k) \times k_3(k)$$

In other words, the function $p_{th}(k)$ maximising the preceding relationship, noted $p^*_{th}(k)$, is determined then the theoretical production indicator is calculated as being:

$$I_{th}(T_{prod}) = \sum_{k=1}^{K} p^*_{th}(k)$$

Once this theoretical production indicator $I_{th}$ has been determined, it is possible to calculate the value of the ratio between the actual production indicator and the theoretical production indicator:

$$R = \frac{I_p(T_{prod})}{I_{th}(T_{prod})}$$

Figure 5:
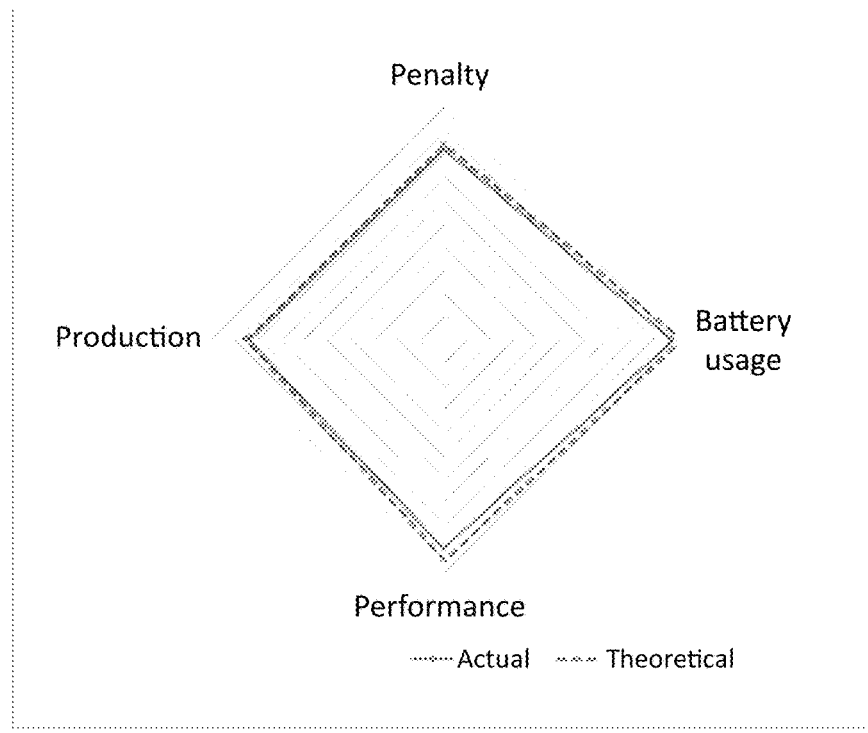
FIG. 5 shows a display of physical quantities associated with a production period.
Figure 6:
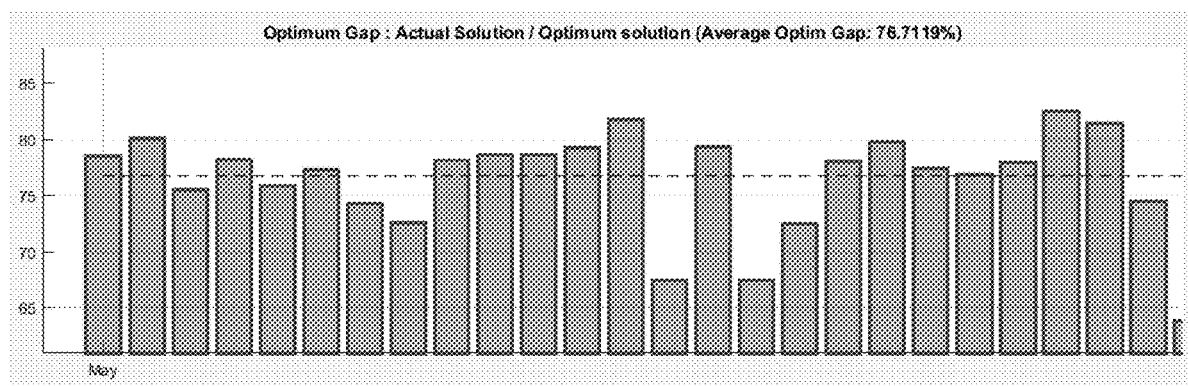
FIG. 6 shows the evolution of the performance of a power plant for several production periods.

It is then possible to measure the performance of the photovoltaic power plant and potentially to detect a malfunction in its operation. In this exemplary embodiment, it will also be possible to carry out a display step 105 as illustrated in FIG. 5. In this figure, the display presents, using a so-called radar graph, the use of the battery, the energy produced (denominated production), the penalty and the performance, that is to say the value of the ratio R between the actual production indicator $I_p$ and the theoretical production indicator $I_{th}$ during a production period. Furthermore, when production periods succeed one another, the display step may also show the evolution of the performance during these different production periods as is illustrated in FIG. 6. In the example of FIG. 6, each production period is represented by a histogram of which the height is representative of the performance (here expressed in %) during the considered production period. As has already been mentioned, such a display notably makes it possible to measure the influence of measures potentially taken to improve the operation of the power plant, but also to pinpoint in a rapid manner the production periods during which faulty operation of the power plant has been observed.

The invention claimed is:

1. A method for measuring a performance of a renewable energy power plant comprising:
   operating the renewable energy power plant during a time production period $T_{prod}$, said renewable energy power plant producing an amount of energy during said time production period $T_{prod}$ and said renewable energy power plant being connected to an energy grid to supply said amount of energy;
   measuring, with a power sensor arranged at an output of the renewable energy power plant, an energy production of the power plant corresponding to said amount of energy over the time production period $T_{prod}$;
   calculating, with an integrated circuit, an actual production indicator from the production measured during the measuring of the energy production;
   calculating, with said integrated circuit, a theoretical production indicator over the time production period $T_{prod}$ from a physical model of the power plant;
   calculating, with said integrated circuit, a ratio between the actual production indicator and the theoretical production indicator over the time production period $T_{prod}$;
   the measurement of the performance being given by a value of the ratio between the actual production indicator and the theoretical production indicator, wherein the actual production indicator is obtained using the following formula:

$$I_p(T_{prod})=\int_0^{T_{prod}}\{k_1(t)p_{measurement}(t)-k_2(t)f(p_{measurement}(t), p_{forecast}(t))\}dt$$

where $I_p$ is the actual production indicator, $p_{measurement}(t)$ is a supplied power at the instant t, $p_{forecast}(t)$ is a forecast power at the instant t, $T_{prod}$ is the time production period, $k_1(t)$ and $k_2(t)$ are time dependent positive weighting factors and f is a function defining a penalty as a function of the supplied power $p_{measurement}(t)$ and the forecast power $p_{forecast}(t)$, and
   adjusting operation of the renewable energy power plant based on the value of the ratio.

2. The method according to claim 1, further comprising displaying the operating performance.

3. The method according to claim 2, wherein the displaying of the operating performance comprises:
   displaying information concerning the value of the actual and/or theoretical production indicator; and
   displaying information concerning the evolution of one or more physical quantities associated with the energy production over the time production period $T_{prod}$.

4. The method according to claim 3, wherein the renewable energy power plant comprises at least one battery, and wherein one of the physical quantities associated with the energy production displayed during the displaying of the operating performance is a state of charge of the battery during the time production period $T_{prod}$ and a theoretical state of charge of the battery for said time production period $T_{prod}$.

5. The method according to claim 1, wherein a theoretical production indicator is a function of the theoretical production over the time production period $T_{prod}$ calculated from the physical model of the power plant.

6. The method according to claim 1, wherein the theoretical production indicator is calculated from the theoretical production $p_{th}(t)$ at an instant t maximising the following relationship, noted $p^*_{th}$:

$$\int_0^{T_{prod}} k_3(t)p_{th}(t)dt$$

where $k_3(t)$ is a time dependent positive weighting coefficient and $p_{th}(t)$ is the theoretical production at a time t, the production indicator being equal to:

$$I_{th}(T_{prod})=\int_0^{T_{prod}} p^*_{th}(t)$$

7. A method for detecting an operational malfunction of a renewable energy power plant, comprising:
   measuring the performance of a renewable energy power plant using a method according to claim 1;

detecting an operational malfunction when the ratio between the actual performance indicator and the theoretical performance indicator is below a predetermined value.

8. A non-transitory computer readable medium, comprising machine executable instructions to perform a method for measuring a performance of a renewable energy power plant according to claim 1.

9. A device for measuring a performance of a renewable energy power plant, the device comprising:
- a power sensor arranged at an output of the renewable energy power plant and configured to measure an energy production of the power plant over a time production period $T_{prod}$; and
- an integrated circuit configured to
    - calculate an actual production indicator from the production measured during the measurement of the energy production;
    - calculate, from a physical model of the power plant, a theoretical production indicator over the time production period $T_{prod}$;
    - calculate a ratio between the actual production indicator and the theoretical production indicator over the time production period $T_{prod}$, wherein the actual production indicator is obtained using the following formula:

$$I_p(T_{prod}) = \int_0^{T_{prod}} \{k_1(t) p_{measurement}(t) - k_2(t) f(p_{measurement}(t), p_{forecast}(t))\} dt$$

where $I_p$ is the actual production indicator, $p_{measurement}(t)$ is a supplied power at the instant t, $p_{forecast}(t)$ is a forecast power at the instant t, $T_{prod}$ is the time production period, $k_1(t)$ and $k_2(t)$ are time dependent positive weighting factors and f is a function defining a penalty as a function of the supplied power $p_{measurement}(t)$ and the forecast power $p_{forecast}(t)$.

* * * * *